(12) United States Patent
Murden (10) Patent No.: US 9,246,455 B2
(45) Date of Patent: Jan. 26, 2016

(54) THREE STAGE AMPLIFIER

(71) Applicant: Franklin M. Murden, Roan Mountain, TN (US)

(72) Inventor: Franklin M. Murden, Roan Mountain, TN (US)

(73) Assignee: ANALOG DEVICES, INC., Norwood, MA (US)

( * ) Notice: Subject to any disclaimer, the term of this patent is extended or adjusted under 35 U.S.C. 154(b) by 31 days.

(21) Appl. No.: 13/855,175

(22) Filed: Apr. 2, 2013

(65) Prior Publication Data

US 2014/0266441 A1    Sep. 18, 2014

Related U.S. Application Data

(60) Provisional application No. 61/794,639, filed on Mar. 15, 2013.

(51) Int. Cl.
*H03F 3/68*     (2006.01)
*H03F 3/45*     (2006.01)
*H03G 3/00*     (2006.01)
*H03F 3/19*     (2006.01)

(52) U.S. Cl.
CPC .............. *H03F 3/68* (2013.01); *H03F 3/45179* (2013.01); *H03F 3/45183* (2013.01); *H03G 3/007* (2013.01); *H03F 3/19* (2013.01); *H03F 2200/408* (2013.01); *H03F 2203/45051* (2013.01); *H03F 2203/45652* (2013.01)

(58) Field of Classification Search
CPC ............ H03F 3/45183; H03F 3/45179; H03F 3/45192; H03F 3/45188; H03F 3/45475; H03F 2203/45702; H03F 3/45071; H03F 1/34; H03F 3/45; H03G 1/0023; H03G 1/0088; H03G 1/0029

USPC .................. 330/253, 254, 260, 310
See application file for complete search history.

(56) References Cited

U.S. PATENT DOCUMENTS

| | | | | |
|---|---|---|---|---|
| 5,446,412 | A   * | 8/1995  | Kimyacioglu et al. | 330/255 |
| 5,900,780 | A   * | 5/1999  | Hirose et al.      | 330/253 |
| 6,801,087 | B2 * | 10/2004 | Ausserlechner      | 330/255 |
| 6,867,618 | B2 * | 3/2005  | Li et al.          | 326/83  |
| 7,248,079 | B2 * | 7/2007  | Bhattacharya et al.| 326/83  |
| 7,586,373 | B2 * | 9/2009  | Kim                | 330/257 |
| 7,924,095 | B2 * | 4/2011  | Yazdi et al.       | 330/260 |
| 7,994,859 | B2 * | 8/2011  | Sutardja           | 330/255 |

(Continued)

OTHER PUBLICATIONS

Xinpeng Xing et al., "A 40MHz 12bit 84.2dB-SFDR Continuous-Time Delta-Sigma Modulator in 90nm CMOS", IEEE Asian Solid-State Circuits Conference (A-SSCC), Nov. 14-16, 2011, XP032090532, pp. 249-252.

(Continued)

*Primary Examiner* — Khanh V Nguyen
(74) *Attorney, Agent, or Firm* — Kenyon & Kenyon LLP (57) ABSTRACT

A cascaded amplifier including a pre-amplifier stage having a pair of first transistors, each of the first transistors having a first gate terminal coupled to a first input voltage, a transconductive (gm) amplifier stage having a pair of second transistors, each of the second transistors having a second gate terminal coupled to a drain terminal of one of the first transistors, and an integrator amplifier stage having a pair of third transistors, each of the third transistors having a third gate terminal coupled to a drain node of one of the second transistors, each of the third transistors having their drain terminals coupled to an output voltage.

29 Claims, 5 Drawing Sheets (56) References Cited

U.S. PATENT DOCUMENTS 8,285,230 B2 * 10/2012 Komori ............... 330/260
2008/0231365 A1 9/2008 Lee et al.

OTHER PUBLICATIONS

Xiao-Yong He et al., "A 0.5-V Wideband Amplifier for a 1-MHz CT Complex Delta-Sigma Modulator", IEEE Transactions on Circuits and Systems II: Express Briefs, US, vol. 56, No. 11, Nov. 1, 2009, XP011334117, pp. 805-809.
Prefasi et al., "A 0.1 mm2, Wide Bandwidth Continuous-Time SD ADC Based on a Time Encoding Quantizer in 0.13 mm CMOS", IEEE Journal of Solid-State Circuits, Piscataway, NJ, USA, vol. 44, No. 10, Oct. 1, 2009, XP011276919, pp. 2745-2754.
EP Communication with European Search Report issued in counterpart European application No. 14158058.9, communication dated Jun. 27, 2014, 9 pages.

* cited by examiner

THREE STAGE AMPLIFIER

CROSS REFERENCE TO RELATED APPLICATION

The present invention benefits from priority afforded by U.S. patent application Ser. No. 61/794,639, entitled "Three Stage Amplifier," filed Mar. 15, 2013, the disclosure of which is incorporated herein in its entirety.

BACKGROUND OF THE INVENTION

The present invention relates generally to signal amplifiers and applications thereof. The accuracy of many electronic systems is degraded if critical amplifiers cannot supply currents that are sufficient to accurately amplify input signals. For example, signal amplifiers are often required to drive loads which partially or wholly comprise a capacitive load. To generate an accurate amplified version of an input signal across these capacitive loads, an amplifier provides high currents which can accurately alter the output signal's amplitude.

An example amplifier is an amplifier in a multiplying digital-to-analog converter (MDAC) of a pipelined analog-to-digital converter system. Such systems are configured with successive converter stages which each convert an analog input signal to respective digital bits of a final digital code that corresponds to the analog input signal.

Integrated circuit MDACs are often configured with capacitors that are switched in a first portion of each sample period to receive a charge from the residue signal of the preceding converter stage and switched in a second portion of each sample period to transfer this charge to an output capacitor. These charging and transferring processes are generally accomplished with the aid of an MDAC amplifier and the accuracy of these processes is dependent upon the ability of this amplifier to provide high-level currents to the MDAC capacitors.

In general, NMOS devices have higher trans-conductance than PMOS devices for the same current density and relative parasitic capacitance values. As a result, NMOS devices are desirable as the gain devices in an amplifier. Although PMOS devices can also be used, PMOS devices are more often used as passive devices, such as current sources for biasing the NMOS gain devices. In a 65 nmLP process, the PMOS devices have slightly lower intrinsic gain, 6.6 vs. 7.5, as their NMOS counterparts and their trans-conductance is about 50% lower.

In order to increase the intrinsic gain of a stage, the output impedance of the PMOS current source, relative to the NMOS device, is high. An output resistance of 15 kilo-ohms can reduce the NMOS gain by 10%. If a single device were used, then the PMOS intrinsic gain would need to be 51, which would require a prohibitively large gate length and associated device parasitic capacitance. As such, the PMOS current sources can be cascoded. If the desire is to stay within the supply rail of the process, then the output swing would be severely compromised. To overcome this problem, the amplifier's current sources are typically cascoded and operate from supplies greater than the supply rail of the process. However, this causes an increase in power and has the undesirable challenge of making sure all devices stay within their operating breakdown voltage during start-up, shutdown, and overdriven conditions.

Prior designs have also used extended supply voltages to cascode devices, calibration, and miscellaneous gain enhancement techniques. While the latter two are desirable for fine line CMOS MDAC amplifiers designs where the intrinsic gains of the devices are small, using the extended supply voltage increases power and reduces reliability. Accordingly, an amplifier that achieves sufficient open loop gain, while still maintaining closed loop bandwidth, is needed.

DETAILED DESCRIPTION OF THE INVENTION

The embodiments of the present invention provide a cascaded amplifier including a pre-amplifier stage having a pair of first transistors, each of the first transistors having a first gate terminal coupled to a first input voltage, a trans-conductive (gm) amplifier stage having a pair of second transistors, each of the second transistors having a second gate terminal coupled to a drain terminal of one of the first transistors, and an integrator amplifier stage having a pair of third transistors, each of the third transistors having a third gate terminal coupled to a drain node of one of the second transistors, each of the third transistors having their drain terminals coupled to an output voltage.

Figure 1:
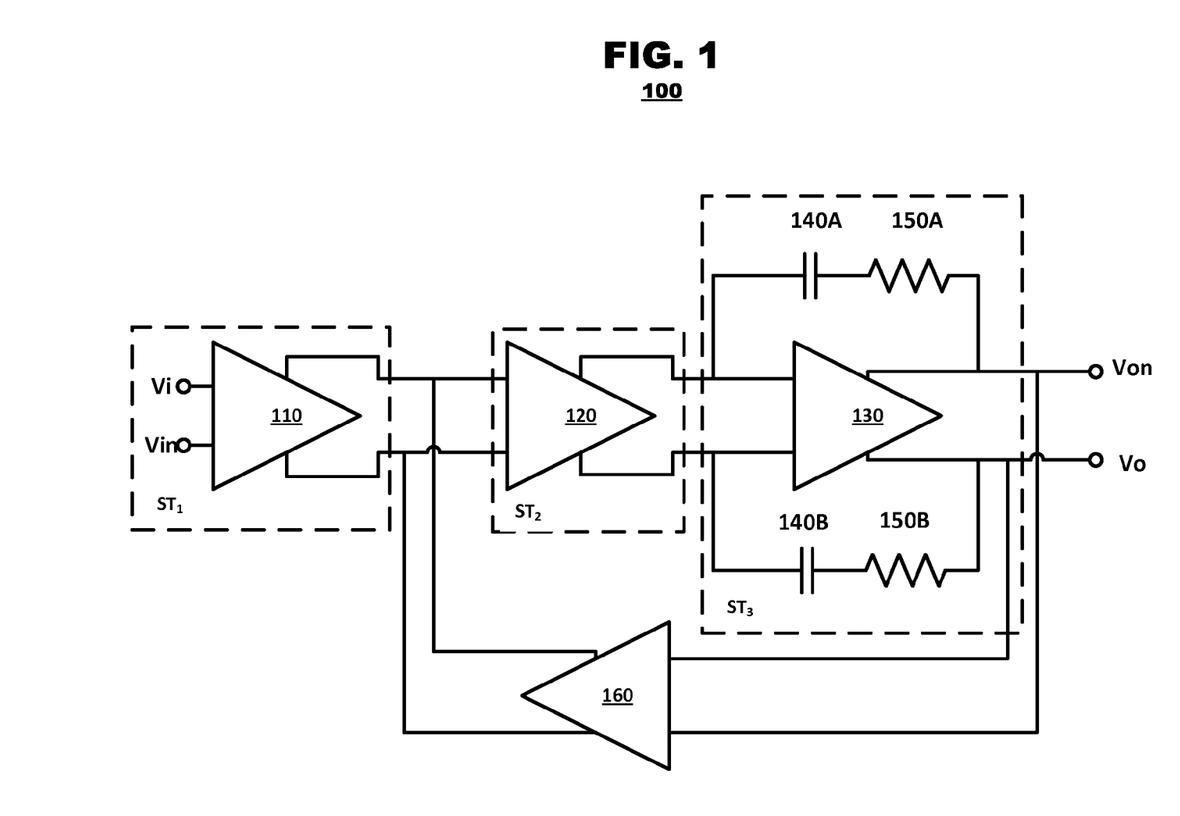
FIG. 1 illustrates a block diagram of a cascaded three stage amplifier according to an example embodiment of the present invention.

FIG. 1 illustrates a block diagram of an amplifier 100 according to an example embodiment of the present invention. The amplifier 100 may have three stages including a pre-amplifier stage $ST_1$, a trans-conductive (gm) stage $ST_2$, and an integrator stage $ST_3$. The pre-amplifier stage $ST_1$ may receive differential voltage inputs ($V_i$, $V_{in}$) that are coupled to pre-amplifier 110. The gm stage $ST_2$ may include gm stage amplifier 120, and integrator stage $ST_3$ may include an amplifier 130 as well as capacitors 140 and resistors 150 to produce a differential voltage at outputs ($V_o$, $V_{on}$). In addition, a feedback loop having amplifier 160 may be included between voltage outputs and the inputs of the gm stage $ST_2$.

In an example implementation, the pre-amplifier stage $ST_1$ may have a gain of 4.5, the gm stage $ST_2$ may have a gain between 7 and infinity (say nominally 70), and the integrator stage $ST_3$ may have a gain 7. In total, the example implementation of amplifier 100 has a nominal open loop gain of 2200 or 67 dB. As will be described below, each stage may have a similar structure, the pre-amplifier stage $ST_1$ varying slightly.

Figure 2:
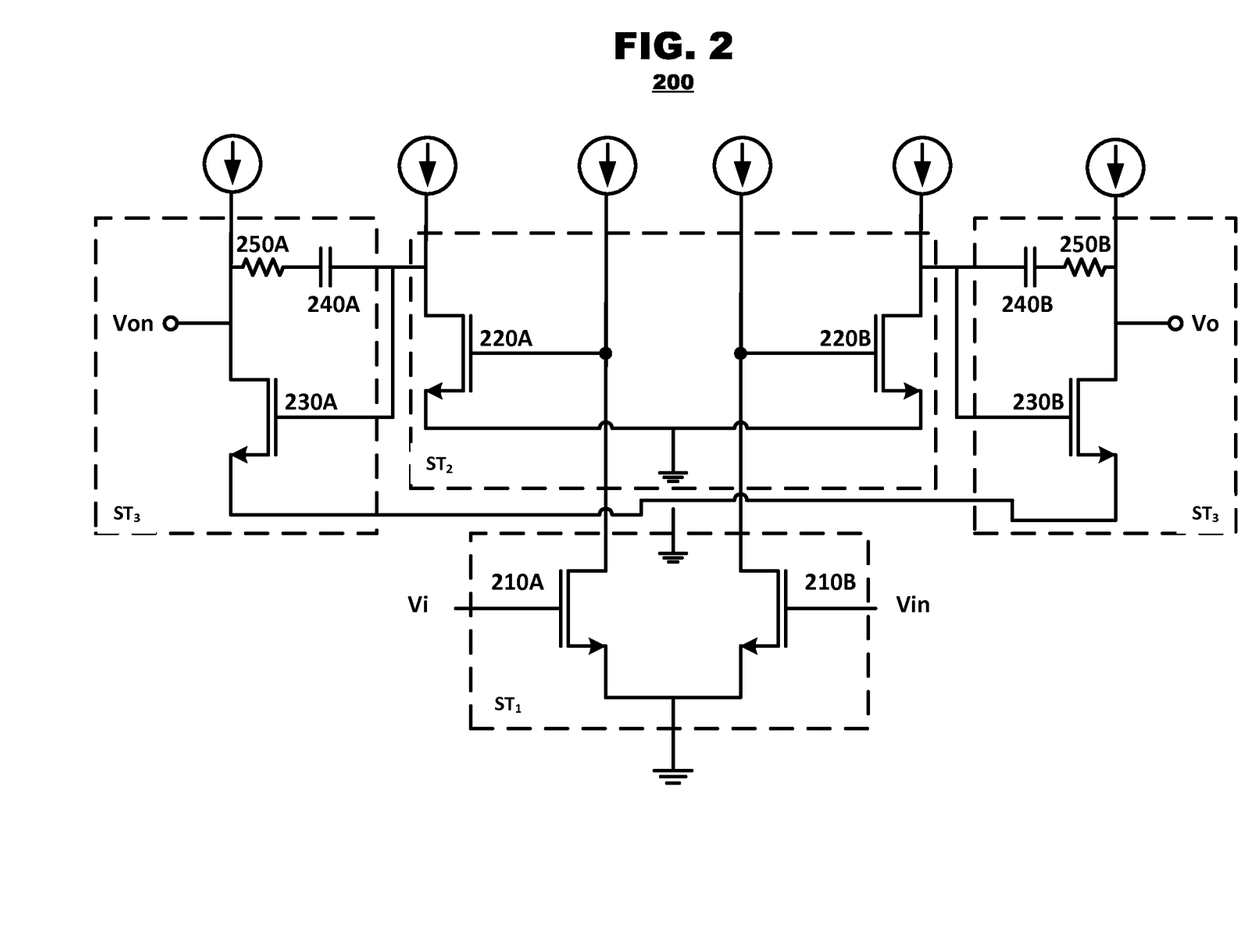
FIG. 2 illustrates a circuit diagram of a cascaded three stage amplifier according to an example embodiment of the present invention.

FIG. 2 illustrates a circuit diagram of an amplifier 200 according to an example embodiment of the present invention. The amplifier 200 may have three stages including a pre-amplifier stage $ST_1$, a gm stage $ST_2$, and an integrator stage $ST_3$. The pre-amplifier stage $ST_1$ may receive voltage inputs ($V_i$, $V_{in}$) that are coupled to pre-amplifier stage transistors 210A, 210B. The gm stage $ST_2$ may include gm stage transistors 220A, 220B, and integrator stage $ST_3$ may include transistors 230A, 230B, capacitors 240A, 240B, and resistors 250A, 250B to produce voltage outputs ($V_o$, $V_{on}$).

Inputs of the amplifier 200 may be provided to gates of pre-amplifier stage transistors 210A, 210B as voltage inputs ($V_i$, $V_{in}$), and the outputs are coupled to gm stage transistors 220A, 220B. The pre-amplifier transistors 210A, 210B drive the gm stage transistors 220A, 220B, and the drains of the gm stage transistors 220A, 220B can be coupled the inputs of integrator stage transistors 230A, 230B. The integrator stage transistors 230A, 230B are coupled to gm stage transistors 220A, 220B through capacitors 240 and resistors 250 to produce voltage outputs ($V_o$, $V_{on}$). The intrinsic gain of the pre-amplifier stage transistors 210A, 210B can also be adjusted by putting a resistor or triode device in parallel with their outputs.

The gain of the pre-amplifier stage $ST_1$ is directly related to the frequency response of the amplifier 100. The frequency response (i.e., loop transfer function) of the amplifier 100 is given as follows:

$$\frac{vo}{vi} = \frac{-1}{\{sCc/(\text{feedback\_gain} * gm * Apre)\}(sTbb+1)(sTpre+1)}$$

As can be understood from the frequency response, the trans-conductance gm needed for the gm stage $ST_2$ can be reduced by the gain of the pre-amplifier stage $ST_1$. If the gain of the pre-amplifier stage $ST_1$ is N, then the size of the gm stage $ST_2$ can be reduced by N.

In operation, the gm stage $ST_2$ can unload the output of the pre-amplifier stage $ST_1$ which also increases the bandwidth of pre-amplifier stage transistors 210. In addition, the gm stage $ST_2$ can drive the input of the integrator stage $ST_3$ to increase its loop gain over frequency (i.e., increase the broad-banding of the non-dominant pole). Accordingly, an increase in the pre-amplifier stage gain Apre reduces the loading of the output of the pre-amplifier stage transistors 210A, 210B and also reduces the loading of the input of the integrator stage transistors 230A, 230B. The closed loop time constant is also a function of the pre-amplifier stage gain Apre.

In some instances, the pre-amplifier gain Apre may be set to be approximately one half or greater the intrinsic gain of pre-amplifier stage transistors 210. In these instances, the output loading of the gm stage to the integrator stage is negligible and can be ignored. The integrator broad-banded time constant Tbb can be reduced due to the increased integrator stage loop feedback and slightly reduced loading.

The frequency response of the amplifier 200 is also a function of a pre-amplifier time constant Tpre associated with the output impedance of the pre-amplifier transistors 210 and input load of 220. In some cases, it may be desirable to maintain an RMS time constant similar to existing two-stage cascaded amplifiers. When trying to emulate a two-stage amplifier, the pre-amplifier time constant Tpre can be set accordingly.

Accordingly, an improved three stage cascaded amplifier is provided. The example amplifier 100 provides sufficient open-loop gain and closed-loop bandwidth. In addition, the amplifier 100 operates within the supply voltage limits (e.g., 1.2V volt supply for a 65 nmLP CMOS process) for a given process. Other advantages include increased gm stage output swing and lower sensitivity to process, supply, and temperature variations. When compared to existing two stage amplifiers, the open loop gain is only slightly reduced, but the frequency characteristics are maintained. The example amplifier architecture is not limited to any particular CMOS technology.

Figure 3:
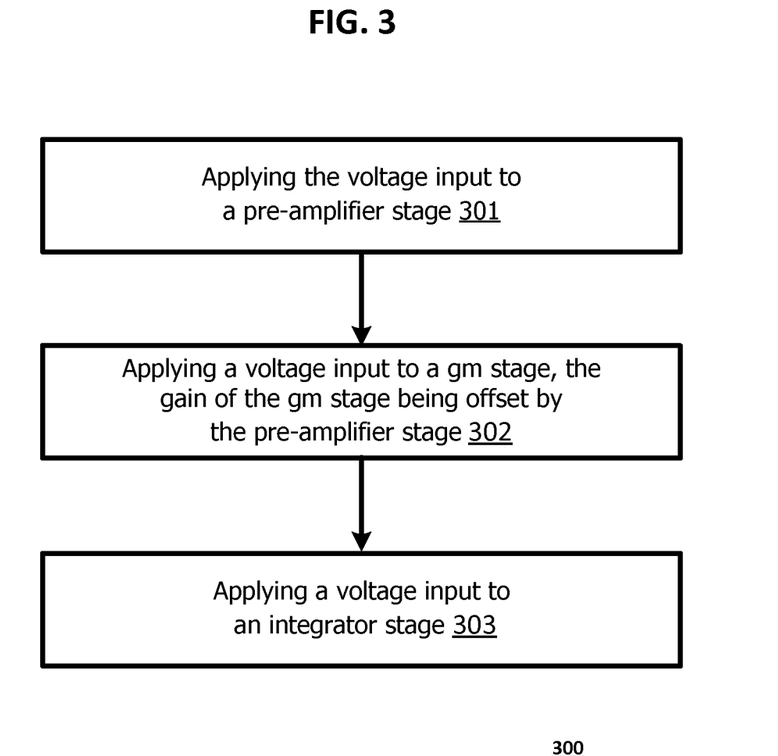
FIG. 3 illustrates a method of amplifying a signal according to an example embodiment of the present invention.

FIG. 3 illustrates a method of amplifying a signal according to an example embodiment of the present invention.

At 301, the pre-amplifier stage transistors 210A, 210B may receive voltage inputs ($V_i$, $V_{in}$). As voltage inputs ($V_i$, $V_{in}$) are amplified by the pre-amplifier stage $ST_1$, the amplitude of the inputs can be increased by a factor of N. Here, the gain of the pre-amplifier stage transistors 210A, 210B can be adjusted by adding a resistor or triode device in parallel with their outputs.

At 302, the gm stage transistors 220A, 220B unload the pre-amplifier stage transistors 210. Since the gain of the pre-amplifier stage is N, the gain of the gm stage can be reduced by N. As discussed above, the frequency response of the three stage amplifier system 200 illustrates that the trans-conductance needed for the gm stage can be reduced by the gain of the pre-amplifier stage transistors 210A, 210B.

At 303, the integrator stage transistors 230A, 230B receive current from the gm stage transistors 220A, 220B through capacitors 240 and resistors 250 to produce voltage outputs ($V_o$, $V_{on}$).

Figure 4:
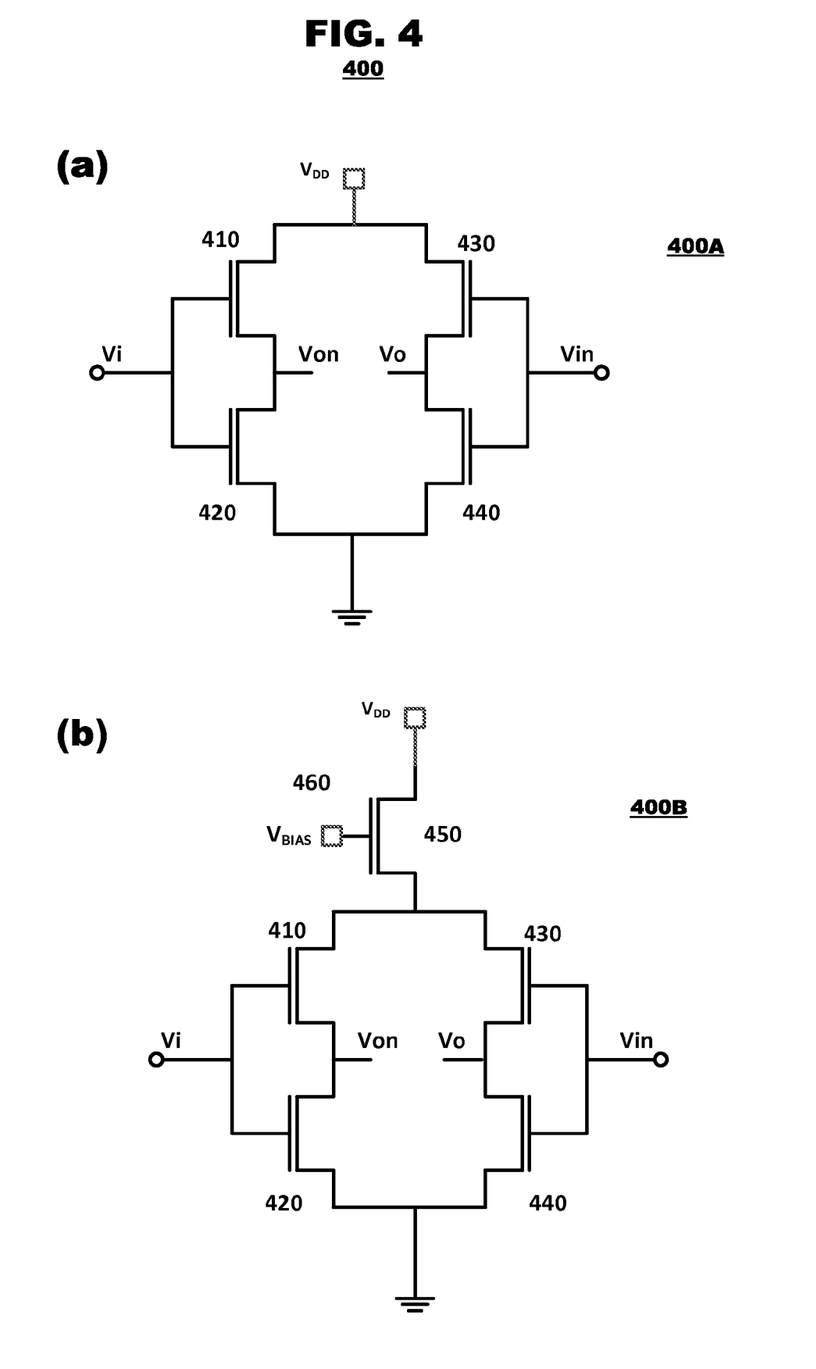
FIG. 4 illustrates a circuit diagram of an amplifier stage structure according to an example embodiment of the present invention.

FIG. 4 illustrates a circuit diagram of an amplifier stage structure 400 according to an example embodiment of the present invention. An alternative structure is shown in FIG. 4(B). The amplifier stage circuit 400 may include two pairs of input transistors 410 and 420 as well as 430 and 440. A first transistor of each pair (i.e., transistors 410 and 430) may provide a conductive path to a first supply voltage $V_{DD}$. A second transistor of each pair (i.e., transistors 420 and 440) may provide a conductive path to ground. Gate terminals of each transistor pair is coupled to an input terminal $V_i$, $V_{in}$, and drain terminals are coupled to output terminals $V_{on}$, $V_o$.

The amplifier 400A illustrated in FIG. 4A is biased between a voltage and ground. Although the amplifier illustrated in FIG. 4B is similar, amplifier 400B also includes a current source transistor 450 coupled to a bias voltage, Vbias 460 to supply the bias current for the amplifier. Alternatively, a bias voltage could also be supplied and coupled to $V_{DD}$. In another alternative, an NMOS current source could bias the amplifier through the sources of the NMOS devices and the PMOS devices could be coupled to $V_{DD}$.

Figure 5:
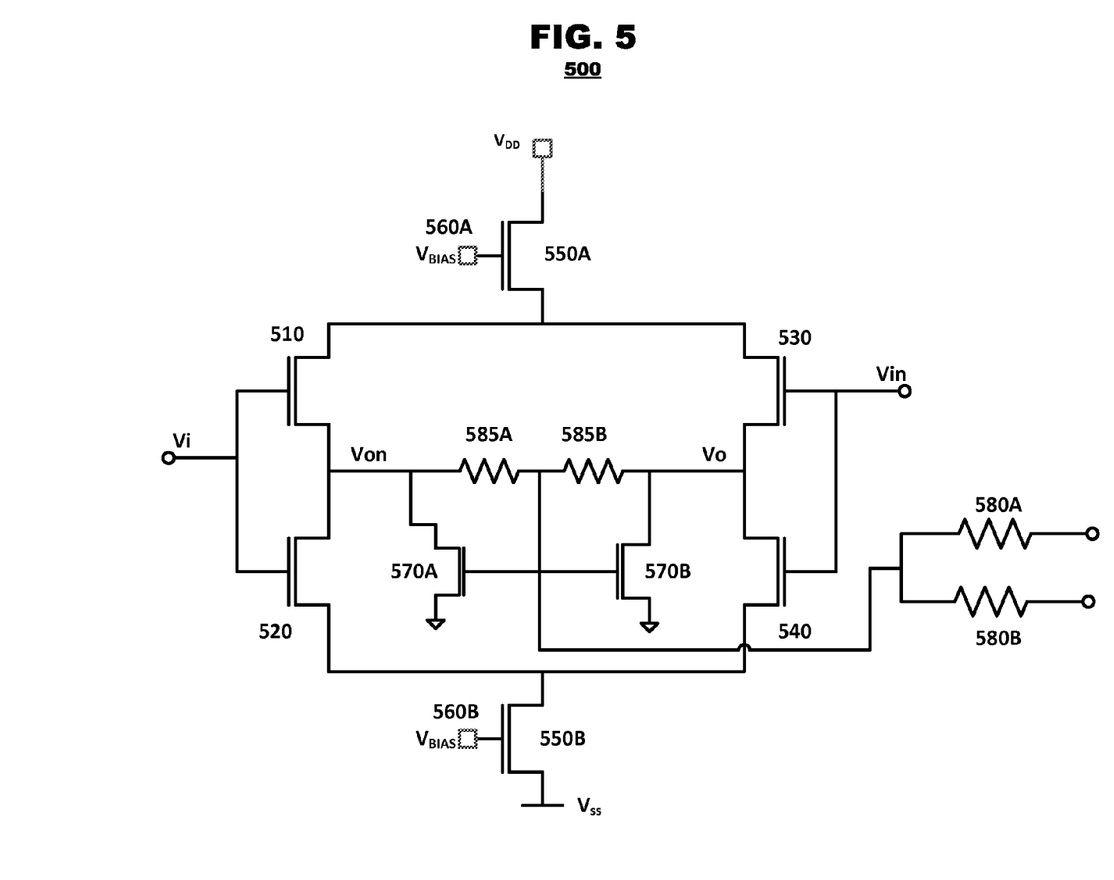
FIG. 5 illustrates a circuit diagram of a pre-amplifier stage structure according to an example embodiment of the present invention.

FIG. 5 illustrates a circuit diagram of a pre-amplifier stage structure 500 according to an example embodiment of the present invention. The pre-amplifier stage circuit 500 may include two pairs of input transistors 510 and 520 as well as 530 and 540. A first transistor of each pair (i.e., transistors 510 and 530) may provide a conductive path to a first supply voltage $V_{DD}$. A second transistor of each pair (i.e., transistors 520 and 540) may provide a conductive path to negative supply voltage Vss (e.g., −1V). Gate terminals of each transistor pair is coupled to an input terminal $V_i$, $V_{in}$, and drain terminals are coupled to output terminals $V_{on}$, $V_o$.

In the pre-amplifier stage 500, each of the output terminals $V_{on}$, $V_o$ is coupled to common mode set transistors 570 and common mode impedance devices 580 and gain impedance devices 585. For example, impedance devices 580A, 580B can be resistors, or switched capacitors. In another example, impedance devices 585A, 585B can be resistors or triode devices.

The pre-amplifier stage 500 also includes current source transistors 550A, 550B coupled to bias voltages, VbiasA 560A and VbiasB 560 B respectively, to supply the bias current for the amplifier. Similar to amplifier stage 400B, alternative implementations of pre-amplifier stage 500 may be implemented. For example, a bias voltage could also be supplied and coupled to $V_{DD}$. In another alternative, an NMOS current source could bias the amplifier through the sources of the NMOS devices and the PMOS devices could be coupled to $V_{DD}$.

It will be apparent to those skilled in the art that various modifications and variations can be made in the input current cancellation scheme for fast channel switching analog to digital converters of the present invention without departing form the spirit or scope of the invention. Thus, it is intended that the present invention cover the modifications and variations of this invention provided they come within the scope of the appended claims and their equivalents.

What is claimed is:

1. A cascaded amplifier arranged in a closed-loop configuration, comprising:
   a pre-amplifier stage having a pair of first transistors, each of the first transistors having a first gate terminal coupled to a first input voltage;
   a trans-conductive (gm) amplifier stage having a pair of second transistors, each of the second transistors having a second gate terminal directly connected to a drain terminal of one of the first transistors; and
   an integrator amplifier stage having a pair of third transistors, each of the third transistors having a third gate terminal directly connected to a drain node of one of the second transistors, each of the third transistors having their drain terminals coupled to an output voltage.

2. The cascaded amplifier according to claim 1, wherein source terminals of the first transistors are directly connected as a differential pair amplifier.

3. The cascaded amplifier according to claim 1, wherein source terminals of the second transistors are directly connected as a differential pair amplifier.

4. The cascaded amplifier according to claim 1, wherein source terminals of the third transistors are directly connected as a differential pair amplifier.

5. The cascaded amplifier according to claim 1, wherein an integrator capacitor is disposed between gate and drain nodes of each of the third transistors.

6. The cascaded amplifier according to claim 5, wherein the integrator capacitor's value determines the closed loop bandwidth of the amplifier.

7. The cascaded amplifier according to claim 1, wherein trans-conductance of the gm stage is increased according to the gain of the pre-amplifier stage.

8. The cascaded amplifier according to claim 1, further comprising a resistor or triode device connected in parallel with the drain terminals of the first transistors of the pre-amplifier stage to control the gain.

9. The cascaded amplifier according to claim 1, wherein the first, second, and third transistors are NMOS transistors.

10. The cascaded amplifier according to claim 1, wherein the first, second, and third transistors are PMOS transistors.

11. A multiplying digital-to-analog converter (MDAC) amplifier comprising the cascaded amplifier according to claim 1.

12. A cascaded amplifier, comprising:
   a pre-amplifier stage having a pair of first transistors, each of the first transistors having a first gate terminal coupled to a first input voltage;
   a trans-conductive (gm) amplifier stage having a pair of second transistors, each of the second transistors having a second gate terminal coupled to a drain terminal of one of the first transistors; and
   an integrator amplifier stage having a pair of third transistors, each of the third transistors having a third gate terminal coupled to a drain terminal of one of the second transistors, each of the third transistors having a drain terminal coupled to an output voltage,
   wherein a gain of the pre-amplifier stage multiplied by a trans-conductance of the gm amplifier stage multiplied by an integrator capacitor value of the integrator amplifier stage controls a closed loop bandwidth of the cascaded amplifier.

13. The cascaded amplifier according to claim 12, wherein the second gate terminals of the second transistors are directly connected to the drain terminals of the first transistors, and the third gate terminals of the third transistors are directly connected to the drain terminals of the second transistors.

14. The cascaded amplifier according to claim 12, wherein source terminals of the first transistors are directly connected to each other, source terminals of the second transistors are directly connected to each other, and source terminals of the third transistors are directly connected to each other.

15. A cascaded amplifier, comprising:
   a pre-amplifier stage having a pair of first transistors, each of the first transistors having a first gate terminal coupled to a first input voltage;
   a trans-conductive (gm) amplifier stage having a pair of second transistors, each of the second transistors having a second gate terminal coupled to a drain terminal of one of the first transistors; and
   an integrator amplifier stage having a pair of third transistors, each of the third transistors having a third gate terminal coupled to a drain terminal of one of the second transistors, each of the third transistors having a drain terminal coupled to an output voltage,
   wherein a gain of the pre-amplifier stage multiplied by a gain of the gm amplifier stage multiplied by a gain of the integrator amplifier stage controls an open loop gain of the cascaded amplifier.

16. The cascaded amplifier according to claim 15, wherein the second gate terminals of the second transistors are directly connected to the drain terminals of the first transistors, and the third gate terminals of the third transistors are directly connected to the drain terminals of the second transistors.

17. The cascaded amplifier according to claim 15, wherein source terminals of the first transistors are directly connected to each other, source terminals of the second transistors are directly connected to each other, and source terminals of the third transistors are directly connected to each other.

18. An amplifier, comprising:
   a first stage having a pair of first transistors, each of the first transistors having a first gate terminal coupled to a first input voltage;
   a second stage having a pair of second transistors, each of the second transistors having a second gate terminal directly connected to a drain terminal of one of the first transistors;
   a third stage having a pair of third transistors, each of the third transistors having a third gate terminal directly connected to a drain node of one of the second transistors, each of the third transistors having their drain terminals coupled to an output voltage; and
   a resistor or triode device connected in parallel with the drain terminals of the first transistors of the first stage to control a gain of the amplifier.

19. A multiplying digital-to-analog converter (MDAC) amplifier comprising the amplifier according to claim 18.

20. An amplifier comprising:
   a pre-amplifier stage coupled to an input voltage;
   a trans-conductive amplifier stage directly connected to an output of the pre-amplifier stage; and
   an integrator amplifier stage directly connected to an output of the trans-conductive amplifier stage,
   wherein at least one of the trans-conductive amplifier stage or the integrator amplifier stage includes:

a pair of first transistors, each of the first transistors being coupled to a first common source node and being coupled to different gate and output nodes; and a pair of second transistors, each of the second transistors being coupled to a second common source node and different gate and output nodes, wherein at least one of the first and one of the second transistors have a common output node.

21. The amplifier according to claim 20, wherein the first transistors are PMOS transistors.

22. The amplifier according to claim 20, wherein the second transistors are NMOS transistors.

23. The amplifier according to claim 20, further comprising a bias current supply coupled to the first common source node.

24. A multiplying digital-to-analog converter (MDAC) amplifier comprising the amplifier according to claim 20.

25. A method, comprising:

applying a voltage input to a first pair of transistors of a pre-amplifier stage;

applying a voltage output at the first pair of transistors of the pre-amplifier stage to a second pair of transistors of a trans-conductive amplifier stage; and applying a voltage output at the second pair of transistors of the trans-conductive amplifier stage to a third pair of transistors of an integrator amplifier stage, wherein a gain of the pre-amplifier stage multiplied by a trans-conductance of the trans-conductive amplifier stage multiplied by a capacitor value of the integrator amplifier stage controls an open loop gain of a connected combination of the pre-amplifier stage, trans-conductive amplifier stage and integrator amplifier stage.

26. The method according to claim 25, wherein source terminals of the first pair of transistors of the pre-amplifier stage are directly connected as a differential pair.

27. The method according to claim 25, wherein source terminals of the second pair of transistors of the trans-conductive amplifier stage are directly connected as a differential pair.

28. The method according to claim 25, wherein source terminals of the third pair of transistors of the integrator amplifier stage are directly connected as a differential pair.

29. The method according to claim 25, wherein the pre-amplifier stage, trans-conductive amplifier stage, and integrator amplifier stage are stages of a multiplying digital-to-analog converter amplifier.

* * * * *